United States Patent [19]

Bhat

[11] Patent Number: 5,771,256

[45] Date of Patent: Jun. 23, 1998

[54] INP-BASED LASERS WITH REDUCED BLUE SHIFTS

[75] Inventor: Rajaram Bhat, Middletown, N.J.

[73] Assignee: Bell Communications Research, Inc., Morristown, N.J.

[21] Appl. No.: 660,330

[22] Filed: Jun. 3, 1996

[51] Int. Cl.$^6$ ........................................................ H01S 3/19
[52] U.S. Cl. .................................. 372/45; 257/14; 372/50
[58] Field of Search .............................. 372/45, 46.5, 43; 257/14, 9.12

[56] References Cited

U.S. PATENT DOCUMENTS

| | | | |
|---|---|---|---|
| 4,815,087 | 3/1989 | Hayashi | 372/45 |
| 4,825,264 | 4/1989 | Inata et al. | 357/4 |
| 5,212,395 | 5/1993 | Berger et al. | 257/185 |
| 5,338,947 | 8/1994 | Watanabe | 257/186 |
| 5,583,878 | 12/1996 | Shimizu et al. | 372/45 |

OTHER PUBLICATIONS

Aoki, et al., "Monolithic Integration of DFB Lasers and Electroabsorption Modulators Using In–Plane Quantum Energy Control of MQW Structures," *International Journal of High Speed and Systems*, vol. 5, No. 1, 1994, pp. 67–90. No month.

Camassel, et al., "Experimental Investigation of the Thermal Stability of Strained InGaAs/InGaAsP MQWs," pp. 36–39, *Proceedings of Fifth International Conference on Indium Phosphide and Related Materials*, Apr. 19–22, 1993, Paris, France (IEEE Catalog #93CH3276–3).

Francis, et al., "Selective Band–Gap Blueshifting of InGaAsP/InGaAs(P) Quantum Wells by Thermal Intermixing with Phosphorus Pressure and Dielectric Capping," *J. Appl Phys.*, vol. 75, No. 7, Apr. 1, 1994, pp. 3607–3610.

Gillin, et al., "Group V Interdiffusion in $In_{0.66}Ga_{0.33}As/In_{0.66}Ga_{0.33}As_{0.7}P_{0.3}$ Quantum Well Structures," pp. 33–35, *Proceedings of Fifth International Conference on Indium Phosphide and Related Materials*, Apr. 19–22, 1993, Paris, France (IEEE Catalog #93CH3276–3).

Glew, "Interdiffusion of InGaAs/InGaAsP Quantum Wells," pp. 29–32, *Proceedings of Fifth International Conference on Indium Phosphide and Related Materials*, Apr. 19–22, 1993, Paris, France (IEEE Catalog #93CH3276–3).

Hamoudi, et al., "Controlled Disordering of Compressively Strained InGaAsP Multiple Quantum Wells under SiO:P Encapsulant and Application to Laser–Modulator Integration," *J. Appl. Phys.*, vol. 78, No. 9, Nov. 1, 1995, pp. 5638–5641.

Odagawa, et al., "High–Speed Operation of Strained InGaAs/InGaAsP MQW Lasers under Zero–Bias Condition," *IEEE Journal of Quantum Electronics*, vol. 29, No. 6, Jun. 1993, pp. 1682–1686.

Rao, et al., "New Encapsulant Source for III–V Quantum Disordering Well," *Appl. Phys. Lett.*, vol. 66, No. 4, Jan. 23, 1995, pp. 472–474.

Vettese, et al., "An Investigation into the Effects of Thermal Annealing on Long Wavelength InGaAs/InGaAsP Multi–Quantum Well Lasers," pp. 40–44, *Proceedings of Fifth International Conference on Indium Phosphide and Related Materials*, Apr. 19–22, 1993, Paris, France (IEEE Catalog #93CH3276–3).

*Primary Examiner*—Rodney B. Bovernick
*Assistant Examiner*—Ellen E. Kang
*Attorney, Agent, or Firm*—Joseph Giordano; David A. Hey; Loria B. Yeadon

[57] ABSTRACT

An InP-based opto-electronic integrated circuit including an active layer having one or more quantum wells (36, 38). According to the invention, a barrier layer (34) of AlGaInAs is formed, preferably between the quantum wells and the substrate (30) to prevent the migration of species from the substrate and lower InP layers that tend to shift the emission wavelengths of the quantum wells to shorter wavelengths, i.e., a blue shift. The barrier layer can be patterned so that some areas of the quantum wells exhibit blue shifting to a shorter wavelength while other areas retain their longer wavelength during annealing.

12 Claims, 5 Drawing Sheets

INP-BASED LASERS WITH REDUCED BLUE SHIFTS

FIELD OF THE INVENTION

The invention generally relates to semiconductor quantum-well structures. In particular, the invention relates to InP and InGaAs quantum-well diode lasers whose fabricational variations can be better controlled.

BACKGROUND ART

Many advanced electronic and opto-electronic integrated circuits are based on compound semiconductors such as the III-V semiconductors. Gallium arsenide (GaAs) is the basis of a fairly well developed technology: indium phosphide (InP) and related materials are not so well developed but have received much attention, especially for active opto-electronic devices, such as lasers and optical modulators, operating in the 1.55 µm band of optical wavelengths which is of great interest for integration with silica optical fibers. Indium gallium arsenide (InGaAs) is often considered to be an InP-based material because alloys with InP can be made that have little change in lattice constant while providing bandgap control of the commercially important part of the optical spectrum around 1550 nm.

A fundamental advantage of III-V semiconductors is that modern film growth techniques, such as organo-metallic chemical vapor deposition (OMCVD) and molecular beam epitaxy (MBE), enable the epitaxial growth of thin films with nearly arbitrary III-V compositions, assuming equality of Group-III cations and Group-V anions, thus allowing many important semiconductor characteristics such as electronic bandgap to be freely engineered. Similar freedom is available with II-VI semiconductors. An important structure that is so enabled is the single or multiple quantum-well (MQW) structure much used for lasers and modulators, an example of which is illustrated schematically in FIG. 1 with the horizontal axis representing the epitaxial growth direction and the vertical axis representing the electronic bandgap for the different materials. For example, an electronic diode structure includes an n-type InP layer 10 and a p-type InP layer 12 sandwiching an undoped active layer 14 comprising alternating thin layers of InGaAs wells 16 and InGaAsP barriers 18. The wells and barriers 16 and 18 are thin enough, usually less than 10 nm, that one or more quantum mechanical valence states 20 and conduction states 22 form within the wells 16. The number of quantum wells may be one or more.

The effective bandgap between the valence and conduction states 20, 22 within the wells 16 depend both upon the well composition and the thickness of the well.

Although the compositions are generally chosen to be lattice matched to the InP substrate, a controlled amount of strain can be introduced into the wells and barriers to further control the electronic band structure. The result is an active layer 14 having a high density of narrow electronic states, assuming the wells 16 have been well fabricated, with the effective bandgap that determines optical characteristics being easily varied. In a typical opto-electronic device, electrical leads are connected to the two InP layers 10, 12 and an unillustrated optical waveguiding structure is formed along the active layer 14 in the directions perpendicular to the illustrated z-direction so as to confine a major portion of the optical wave within the active layer 14 to there interact with the electrically controlled carriers.

However, the process of forming the optical confinement structure tends to degrade the multi quantum-well structure. A typical though sim heterostructure MQW laser is illustrated in cross section in FIG. 2. The vertical planar structure of FIG. 1 is grown and then patterned and etched so as to form a ridge extending along the v-direction and having a finite width along the x-direction of the active layer 14 including the multiple quantum wells. Thereafter, a semi-insulating InP 24 is epitaxially regrown around the ridge to reduce the contrast of the refractive index of the active layer 14 relative to that of the surrounding material and to confine the biasing current to the active layer 14. The structure shown in FIG. 2 is simplified for ease of presentation.

More layers may be included to, for example, better confine the light to the core, but the illustrated structure is sufficient to explain the effect of the invention. More realistic structures for buried heterostructure lasers are described by Odagawa et al. in "High-Speed Operation of Strained InGaAs/InGaAsP MQW Lasers Under Zero-Bias Condition," *IEEE Journal of Quantum Electronics*, vol. 29, 1993, pp. 1682–1686 and by Aoki et al. in "Monolithic integration of DFB lasers and electroabsorption modulators using in-plane quantum energy control of MQW structures, *International Journal of High Speed Electronics and Systems*, vol. 5, 1994, pp. 67–90.

The regrowth of the fairly thick semi-insulating layer 24 imposes a large thermal budget on the already fabricated quantum wells. Even the after grown upper cladding layer 12 incurs a significant thermal budget. OMCVD of these materials is typically done between 625° and 650° C. so that temperatures between 600° and 700° C. should be anticipated. Even higher temperatures may be required for explicit annealing. The thermal treatment of the quantum wells in these temperature ranges has been generally observed to shift the bandgap between the well states to the blue. That is, the effective bandgap of the well states anneal to larger bandgap energy. Also, the potential wells tend to lose their rectangular shape. The structure described by Aoki et al., ibid., includes both lasers and modulators having different well thickness and involves two regrowths, one for the upper, p-type InP layer and another for the semi-insulating InP. Thus significant blue shifting is expected, but the amount of blue shift will differ between the laser and modulator because of the differing well thicknesses.

The size of the blue shift has been observed to shift the photoluminescence peak by about 10 to 40 nm at devices designed for 1550 nm. However, the shift varies across a wafer and from wafer to wafer. A shift in the wavelength peak of the photoluminescent emission presents a problem in fabricating lasers and modulators since, for example, optimum performance in distributed feedback lasers requires the wavelength of the gain peak to match the grating pitch. In the case of modulators, a variation of the blue shift between different ones of the multiple quantum wells will produce a less steep change of absorption with wavelength, thereby degrading the modulator performance.

Several suggestions have been made to reduce the blue shift. One entails the use of substrates with high dislocation densities, the dislocation pipes acting as gettering sites for the species, speculated to be phosphorus interstitials, responsible for the blue shift. This solution is not attractive because heavily dislocated substrates introduce concerns about the reliability of devices formed on them.

Another suggestion involves the use of strained quantum wells in which both the wells and the barriers have the same compositional ratio As/P of the Group-V components, thereby avoiding any effect from the mobile phosphorus. Although this solution seems effective, it restricts the device design.

Several groups have reported their understanding of the mechanism for blue shift in *Proceedings of Fifth International Conference on Indium Phosphide and Related Materials*, Apr. 19–22, 1993, Paris, France (IEEE Catalog #93CH3276-3). See Glew, "Interdiffusion of InGaAs/InGaAsP quantum wells," ibid., pp. 29–32; Gillin et al., "Group V interdiffusion in $In_{066}Ga_{033}As/In_{066}Ga_{033}As_{07}P_{03}$ quantum well structures," ibid., pp. 33–35; Camassel et al., "Experimental investigation of the thermal stability of strained InGaAs/InGaAsP MQWs," ibid., pp. 36–39; and Vettese et al., "An investigation into the effects of thermal annealing on long wavelength InGaAs/InGaAsP multi-quantum well lasers," Ibid., pp. 40–44. Although diffusion of phosphorus is a recurring theme, there is no agreement on the responsible mechanism.

Accordingly, a more reliable and less restrictive method is desired for controlling and reducing the blue shift in InP-based and related quaternary quantum-well structures.

SUMMARY OF THE INVENTION

The invention can be summarized as a quantum-well structure based on compound semiconductors, particularly InP, InGaAs, and related III-V semiconductors, in which a barrier layer is formed between the quantum wells and the substrate. Preferably, the barrier layer contains aluminum, e.g., may be AlGaInAs, and it prevents the diffusion of species from the substrate into the quantum wells that would otherwise cause a blue shift in the quantum-well electronic states.

DETAILED DESCRIPTION OF THE PREFERRED EMBODIMENTS

According to the invention, a III-V semiconductor layer including a substantial aluminum content acts as a diffusion barrier for quantum-well layers grown on its top. In a particularly important application of the invention, a layer of AlGaInAs is epitaxially deposited above an InP substrate to act as an effective diffusion barrier against species in the substrate so as to protect quantum wells and barriers formed on the AlGaInAs barrier layer. The quantum-well structure is composed of compound semiconductors, such as the III-V material combinations of InGaAsP/InGaAs, InGaAsP/InGaAsP, InP/InGaAs, and InP/InGaAsP.

The thickness of the barrier layer preferably lies within the range of 100 nm to 500 nm. The preferred AlGaInAs barrier material has a composition that is preferably lattice matched to InP although it can be slightly strained as long as the thickness of a strained layer does not exceed the pseudomorphic limit beyond which dislocations are generated. Preferably, the AlGaInAs barrier material has an Al content between an AlInAs composition and an AlGaInAs composition providing a bandgap wavelength of $\lambda_g=1.3$ μm. The bandgap energy of $Al_xGa_yIn_{1-x-y}As$ that is lattice matched to InP is given by $$E_g(eV) = 0.75 + 1.548x, \qquad (1)$$

with $$1-x-y = 0.53, \qquad (2)$$

and the bandgap wavelength is given by $$\lambda_g(nm) = \frac{1238}{E_g(eV)}. \qquad (3)$$

The barrier layer may additionally contain other constituents to provide more complete bandgap and strain engineering. In particular, some phosphorus may be included.

Figure 1:
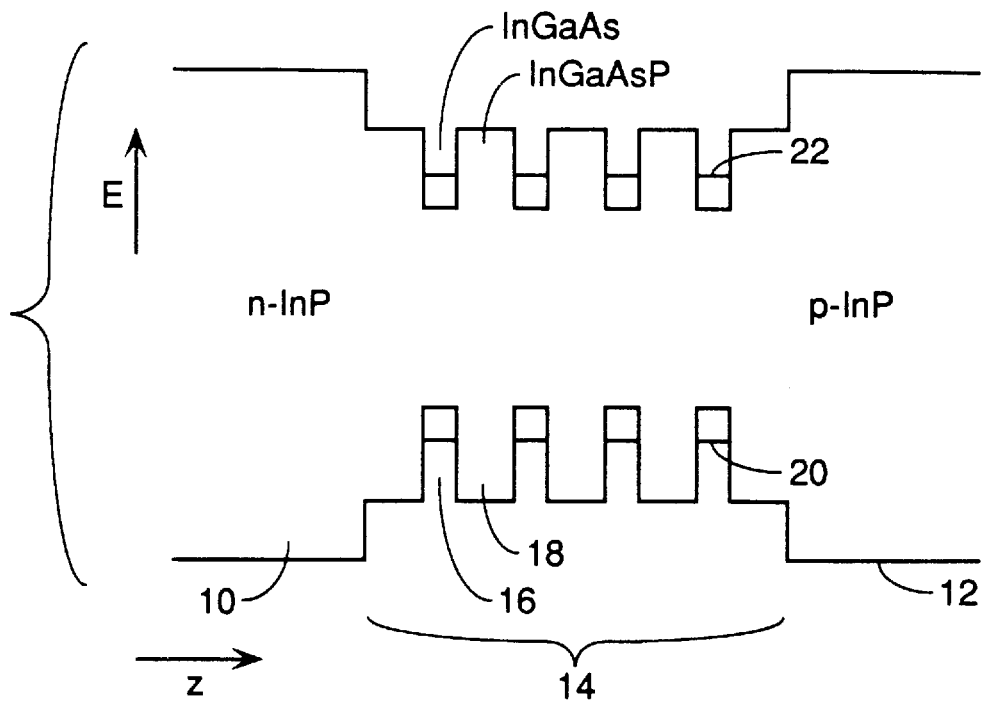
FIG. 1 is a schematical representation of the composition and band structure of a conventional semiconductor diode having a multi quantum-well active layer.
Figure 2:
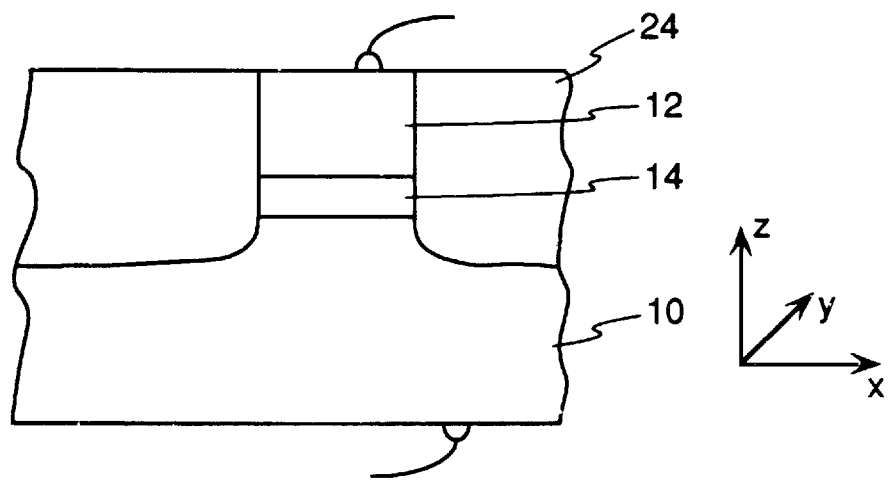
FIG. 2 is a cross-sectional view of a conventional buried heterostructure laser incorporating the multi quantum-well structure of FIG. 1.
Figure 3:
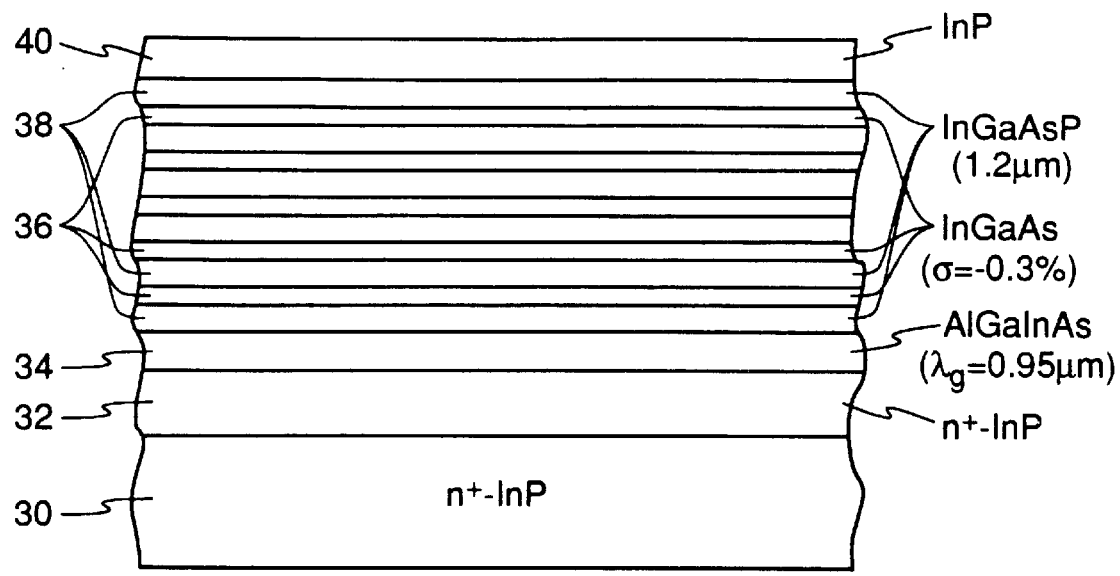
FIG. 3 is a cross-sectional view of a first embodiment of the invention including an AlGaInAs barrier layer below multiple InP-based quantum wells and above an InP buffer layer.

A first embodiment of the invention is shown in cross section in FIG. 3. On an $n^+$-type InP substrate 30 are epitaxially deposited an $n^+$-type InP buffer layer 32 having a thickness of 0.5 to 1.0 μm, over which is epitaxially deposited an AlGaInAs barrier layer 34 having a photoluminescent bandgap of $\lambda_g=0.95$ μm. Its thickness is the range of 0.1 to 0.5 μm. In general, in a diode structure the layers on opposite sides of the active region are fairly heavily doped to opposite conductivity types. However, the doping is required only if the layer is relatively thick. If their thickness is 0.1 μm or less, undoped or partially doped layers still provide the required conductivity to the active region. Here, an undoped 1 μm-thick AlGaInAs barrier layer 34 becomes part of the adjacent active region.

An undoped multi quantum-well structure is epitaxially deposited over the barrier layer 34, and it includes 5 periods of alternating quantum-well layers 36 and barrier layers 38 plus an additional end barrier. The quantum-well layer 36 has a composition of InGaAs with a tensile strain of σ=−0.3% and a thickness of 7 nm. The barrier layer has a composition of InGaAsP with $\lambda_g=1.2$ μm and a thickness of 10 nm. Over the quantum-well structure is epitaxially grown an InP undoped protective capping layer 40 having a thickness of about 0.1 μm. The composition of the capping layer 40 was chosen for experimental purposes and to provide a close comparison to the comparative example. In commercial devices, the capping layer may be formed of the quaternary InGaAsP although it is not clear that would even be required. Other layers may be grown over the capping layer 40 depending on the requirements of the optical structure. In any case, the AlGaInAs barrier layer 34 prevents interdiffusion between the quantum-well structure 36, 38 and the InP substrate 30. The specific structure, compositions, and thicknesses presented both above and below are understood to be by way of example only. Alternative embodiments of the invention may differ.

Figure 4:
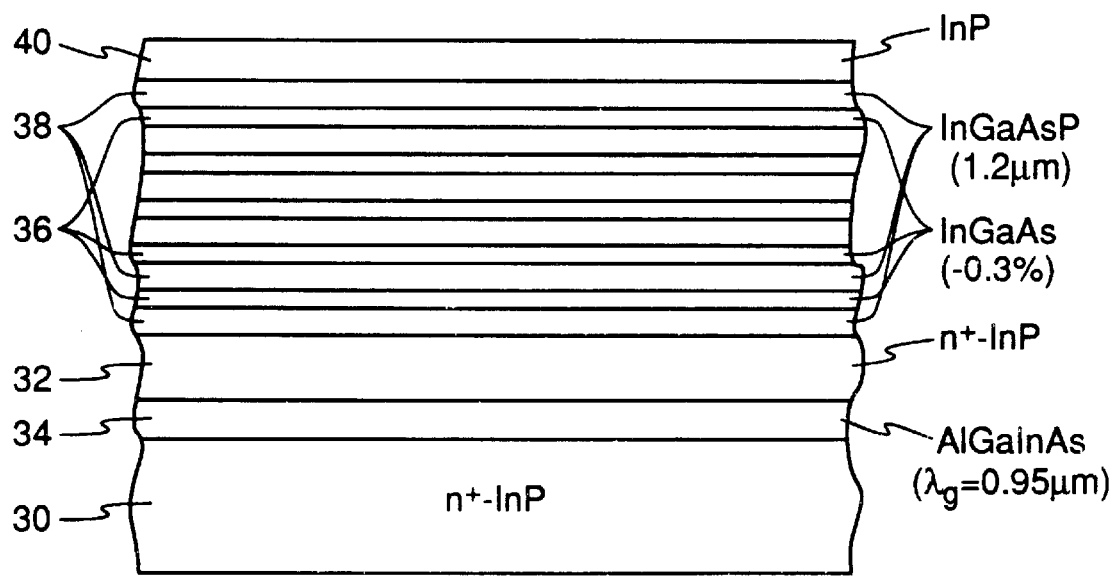
FIG. 4 is a cross-sectional view of a second embodiment of the invention including the AlGaInAs barrier layer below the InP buffer layer.

The second embodiment of the invention shown in the cross section of FIG. 4 differs from that of FIG. 3 in that the AlGaInAs barrier layer 34 is placed beneath the InP buffer layer 32 and the buffer layer 32 is adjacent to the quantum-well structure 36, 38. This embodiment recognizes the fact that the 1 μm-thick buffer layer 32 contributes little to the diffusion of Group-V components, if indeed that is the cause of blue shifting, so that the buffer layer 32 can be placed between the barrier layer 34 and the quantum-well structure 36, 38.

Figure 5:
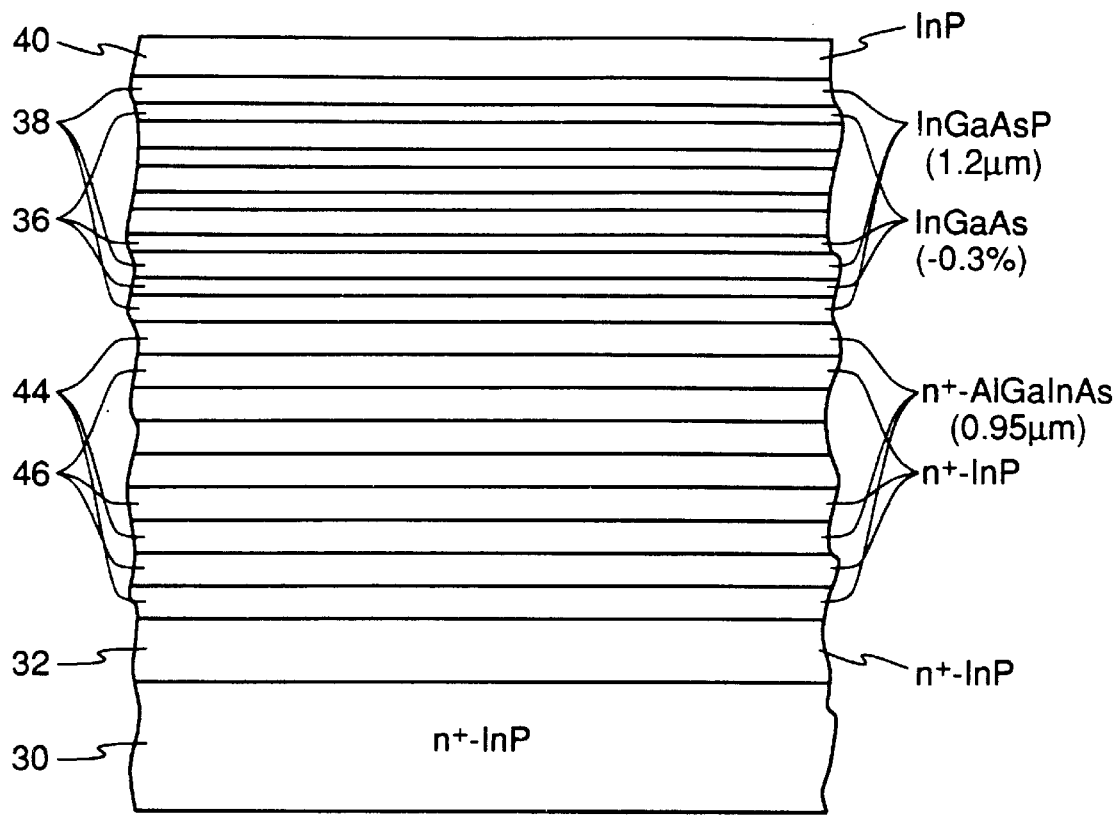
FIG. 5 is a cross-sectional view of a third embodiment of the invention including a principal InP buffer layer and in which the AlGaInAs barrier layer is subdivided and interleaved with additional InP buffer layers.

The third embodiment of the invention shown in the cross section of FIG. 5 differs from the second embodiment of FIG. 4 in that the AlGaInAs barrier layer is divided into five $n^+$-type AlGaInAs ($\lambda_g$=1.2 μm) barrier sub-layers 44 interleaved with four $n^+$-type InP buffer sub-layers 46 in a superlattice structure. The AlGaInAs barrier sub-layers 44 and the InP buffer sub-layers 46 all have thicknesses, for example, of 0.1 μm. The buffer sub-layers 46 together with the initial InP buffer layer 32 present a high-quality substrate for subsequent epitaxial growth while the barrier sub-layers 44 prevent interdiffusion of species within the underlying InP into the quantum-well structure 36, 38. In the third embodiment, the material immediately underlying the quantum-well structure 36, 38 is one of the barrier sub-layers 44 so that not even a thin InP layer has unimpeded access to the quantum wells.

Figure 6:
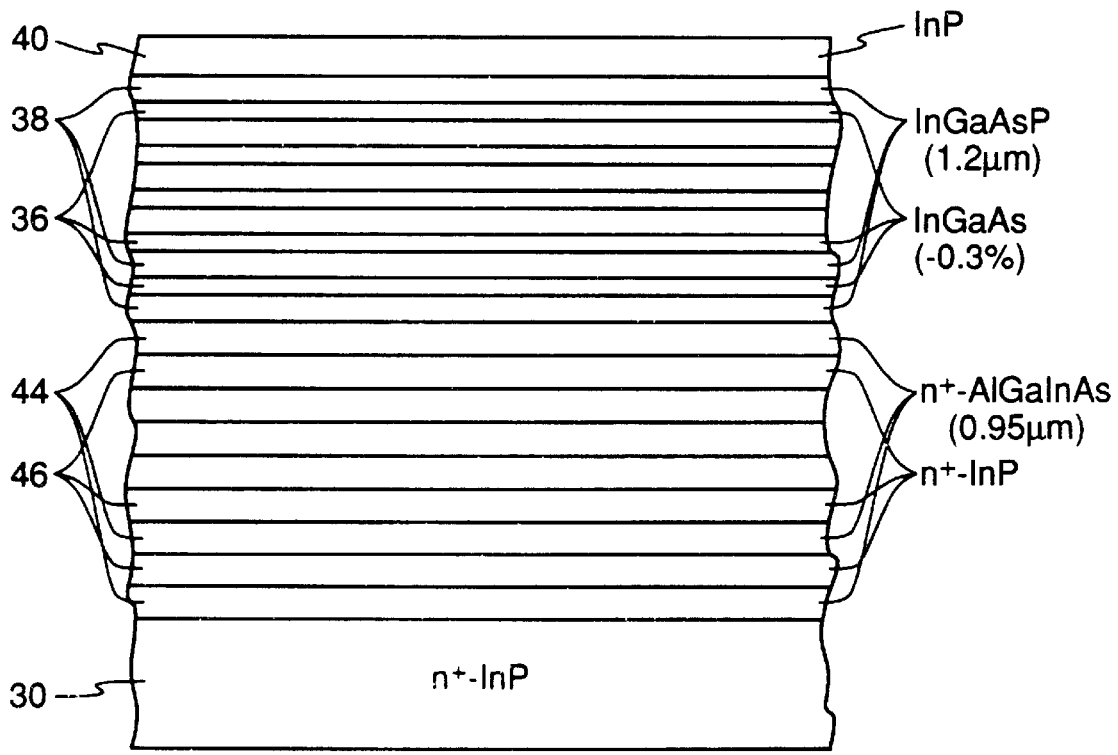
FIG. 6 is a cross-sectional view of a fourth embodiment of the invention which lacks the principal InP buffer layer of the third embodiment.

The fourth embodiment of the invention illustrated in cross section in FIG. 6 differs from the third embodiment of FIG. 5 in that it lacks the initial InP buffer layer 32, so that the superlattice of the barrier and buffer sub-layers 44, 46 is grown directly on the substrate 30.

Figure 7:
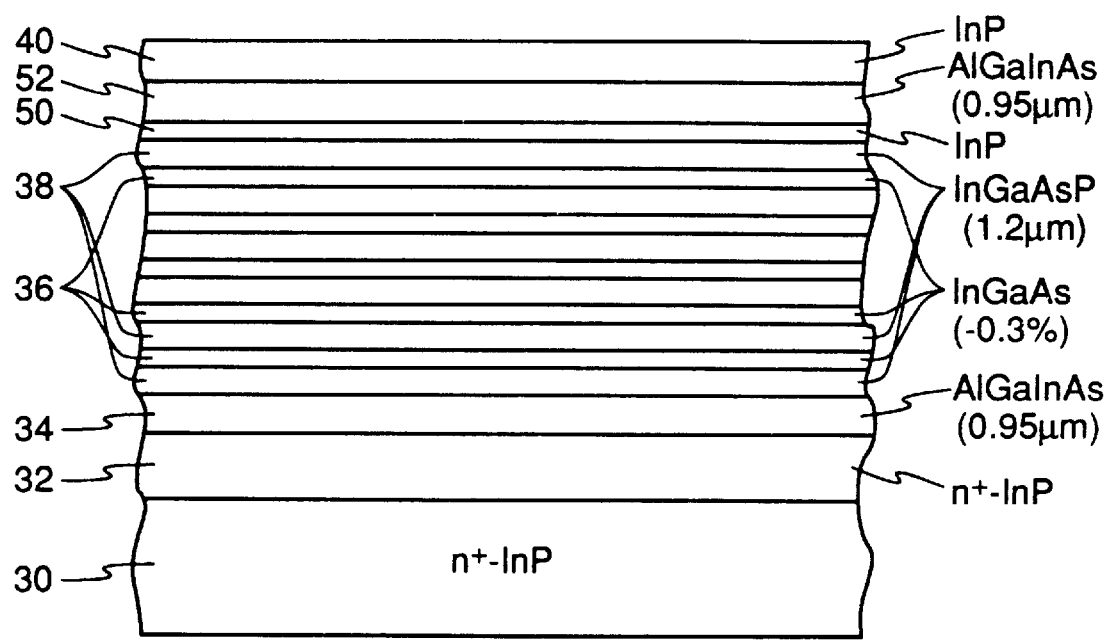
FIG. 7 is cross-sectional view of a fifth embodiment of the invention including a barrier layer formed over the quantum wells.

The fifth embodiment of the invention illustrated in cross section in FIG. 7 improves upon the first embodiment of FIG. 3 in including a barrier layer above the quantum-well structure. In particular, a thin upper InP protective layer 50 is epitaxially formed over the quantum-well structure 36, 38 to a thickness of 10 nm. This layer 50 was included for experimental purposes and in commercial devices may be replaced by a quaternary InGaAsP protective layer or dispensed with completely. Over the thin protective layer 50 are formed an upper AlGaInAs barrier layer 52 having a thickness of 0.1 μm and then the 0.1 μm-thick InP capping layer 40. The upper barrier layer 52 protects the quantum-well structure 36, 38 from the phosphorus-containing phosphine environment used in an annealing step and also protects it from interdiffusion from the InP capping layer 40 and whatever layers are formed thereover, although it is not clear that interdiffusion from overgrown epitaxial layers is a problem. In any case, the upper InP protective layer 50 is so thin that it does not present a significant source of blue-shifting species.

In some of the experimental samples, up to 2 μm of InP have been grown over an quantum-well structure not protected on its upper side by a barrier layer. No blue shifts have been attributed to this thick InP overlayer. It is thus believed that the species responsible for blue shifts originates from the much thicker InP substrate.

EXPERIMENT

The inventive structure of the first embodiment of FIG. 3 was grown by OMCVD at 76 Torr and at a growth rate of about 1.3 nm/s. The precursor reagents were trimethylgallium, trimethylaluminum, arsine, and phosphine in a carrier gas of hydrogen. lhydrogen sulfide or disilane was used to obtain n-type doping; diethylzinc was used for p-type doping. A comparative structure was grown with the same general structure and by the same process, but it lacked the AlGaInAs barrier layer 34.

After the inventive and comparative structures were grown, they were both subjected to a planar regrowth process typical of forming a buried MQW heterostructure waveguide. Then, the quantum-well structure was tested for its photoluminescence, both before and after the regrowth. The results are shown in TABLE 1.

TABLE 1

|  | Photoluminescence Peak Before Regrowth (nm) | Blue Shift (nm) |
| --- | --- | --- |
| Inventive Example | 1515 | 0–2 |
| Comparative Example | 1515 | 13.6–23.2 |

These data show that the blue shift of the 1515 nm peak was reduced by almost a factor of ten by use of the invention.

The invention allows the blue shift to be localized to selected areas of the opto-electronic integrated circuit. Such a process is particularly useful for integrating both lasers and modulators onto the same OEIC, the two elements requiring somewhat different peaks in the MQW emission spectra. Similar selective blue shifting has been described by Francis et al. in "Selective band-gap blueshifting of InGaAsP/InGaAs(P) quantum wells by thermal intermixing with phosphorus pressure and dielectric capping," *Journal of Applied Physics*, vol. 75, 1994, pp. 3507–3510 and by Hamoudi et al. in "Controlled disordering of compressively strained InGaAsP multiple quantum well under SiO:P encapsulant and application to laser-modulator integration," *Journal of Applied Physics*, vol. 78, 1995, pp. 5638–5641. The selective blue shifting of the invention provides more flexibility than the process that described by Aoki et al., ibid, in achieving different characteristic wavelengths in integrated lasers and modulators.

According to the invention, the selective localization of the blue shift is accomplished by patterning one or more barrier layers. A sixth embodiment of the invention utilizing localized blue shifting, illustrated in cross section in FIG. 8, differs from the second embodiment of FIG. 4 in that a bottom AlGaInAs barrier layer 60 partially underlying an InP buffer layer 62 beneath the quantum-well structure 36, 38 is patterned into two sets of regions 64, 66. Except for the patterning, the barrier layer 60 is same as barrier layer 34 of FIG. 4 and the buffer layer 62 is the same as buffer layer 32 of FIG. 4, but the buffer layer 62 additionally acts as a planarizing layer to smoothly cover the apertured barrier layer 60. The first set of regions 64 include the barrier layer 60 and thus experience minimal blue shift; however, the barrier layer 60 does not does extend into the second region 66, which thus experiences substantial blue shifting.

A related seventh embodiment of the invention patterns a barrier only above the quantum wells. As illustrated in cross section in FIG. 9, the quantum-well structure 36, 38 is grown directly on the InP buffer layer 32 with no underlying barrier layer. Instead a barrier layer 68 having the physical characteristics of the barrier layer 34 of FIGS. 3 and 4 is deposited and patterned so that the barrier layer 68 exists in first regions 70 but is absent in a second region 72. An InP capping layer 74 is deposited over the patterned barrier layer to both protect the underlying structure and to planarize its upper surface.

In the seventh embodiment, the barrier layer 68 in the first regions 70 prevents the further upward migration of the species responsible for the blue shift, which are relatively free to migrate upwardly from the InP substrate 30. Hence, the species accumulate in the quantum-well structure 36, 38 within the first regions 70 and a large blue shift is observed there. However, in the second region 72 unprotected by an upper barrier, the blue shifting species migrate through the quantum-well structure 36, 38 and continue upwardly from there. Hence, some of the blue shifting species remain in the second region 72 but to a lesser amount than in the first regions 74. Therefore, there is some blue shift in the second region 72 but less than the blue shift in the first regions 70.

Figure 8:
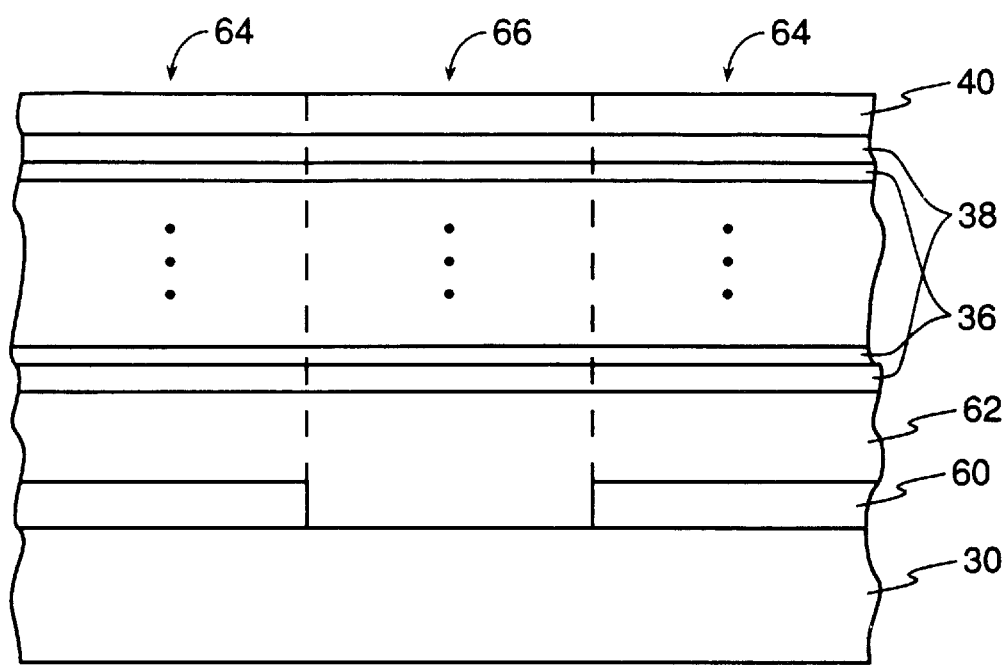
FIGS. 8 and 9 are cross-sectional view of sixth and seventh embodiments of the invention is which the barrier layer is patterned to provide laterally varying blue shifts.
Figure 9:
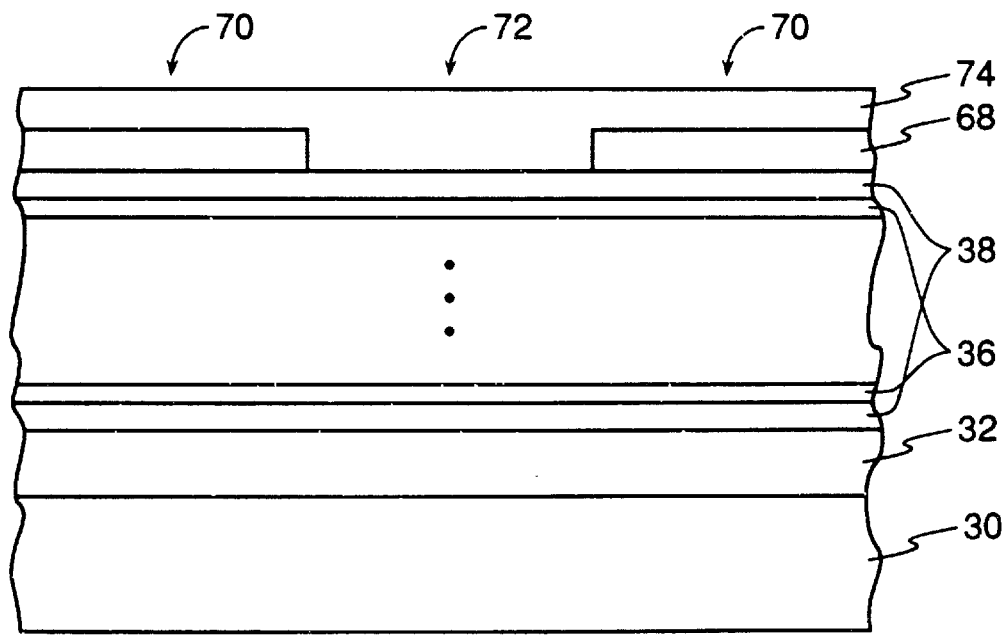

Although the patterned cross sections of FIGS. 8 and 9 show a fairly narrow aperture in the barrier, a particularly useful application of the patterned blue shifting using fairly large patterning and includes a MQW diode laser positioned within the lowerenergy, less blue-shifted region and an MQW optical modulator positioned within the higher-energy, more blue-shifted region.

Although the examples and described embodiments of the invention have included multiple quantum-wells, the invention can be applied to structures with single quantum wells and other devices requiring very thin semiconductor layers where the thickness is critical.

Although the quantum wells of the described embodiments have been incorporated into a buried heterostructure laser waveguide, the invention is not so limited. Optical MQW structures can be formed in a number of configurations and for different uses, for example, the described optical modulators. Indeed, quantum wells can be advantageously used in non-optical electrical circuits.

The invention thus provides an easy and economical method of reducing the blue shift in quantum-well devices. For unpatterned barriers, an extra deposition step is required for each barrier layer or sub-layer, but the extra growth incurs little penalty. For patterned barriers, an extra step of lithographically defining the barrier layer is required, but two regions of differing bandgap are thereby obtained.

What is claimed is:

1. A quantum well device comprising:
   a substrate comprising indium and phosphorous;
   an InP-based quantum-well structure epitaxially formed on said substrate; and
   means for preventing a blue shift in the quantum-well electronic states due to the diffusion of species from the substrate into the quantum-well structure, said means comprising at least one barrier layer comprising aluminum, indium, and arsenic epitaxially formed on said substrate in cooperation with said quantum-well structure.

2. The device of claim 1, wherein said barrier layer additionally comprises gallium.

3. The device of claim 2, wherein said barrier layer is formed between said substrate and said quantum-well structure.

4. The device of claim 3, further comprising a buffer layer disposed between said substrate and said quantum-well structure and comprising indium and phosphorus.

5. The device of claim 2, wherein said barrier layer is formed over said quantumwell structure.

6. The device of claim 1, wherein said quantum-well structure is formed into a waveguide structure extending along a surface of said substrate.

7. The device of claim 1, wherein said barrier layer is laterally patterned to provide multiple regions of said quantum-well structure having differing characteristic optical wavelengths.

8. The device of claim 1, wherein said barrier layer has a thickness of at least 100 nm.

9. A quantum-well device comprising:
   a substrate comprising indium and phosphorous;
   an InP-based quantum-well structure epitaxially formed on said substrate;
   a buffer layer disposed between said substrate and said quantum-well structure and comprising indium and phosphorous; and
   at least one barrier layer comprising aluminum, indium, and arsenic epitaxially formed on said substrate in cooperation with said quantum-well layer, where both said barrier layer and said buffer layer comprise respective pluralities of sub-layers interleaved with each other.

10. An InP based quantum well device comprising:
    a substrate comprising InP;
    a barrier layer comprising Al, Ga, In, and As epitaxially formed on said substrate; and
    a quantum-well structure epitaxially formed on said barrier layer and comprising compositional pairs of materials selected from the group consisting of InGaAsP/InGaAs, InGaAsP/InGaAsP, InP/InGaAs, and InP/InGaAsP, wherein said barrier layer comprises a plurality of barrier sub-layers and further comprising a plurality of buffer sub-layers comprising InP and interleaved with said barrier sub-layer.

11. An InP based quantum well device comprising:
    a substrate comprising InP;
    a quantum-well structure comprising compositional pairs of materials selected from the group consisting of InGaAsP/InGaAs, InGaAsP/InGaAsP,InP/InGaAs, and InP/InGaAsP; and
    means for preventing a blue shift in the quantum well electronic states due to the diffusion of species from the substrate into the quantum-well structure, said means comprising a barrier layer comprising Al, Ga, In, and As epitaxially formed on said substrate, said quantum-well structure being epitaxially formed on said barrier layer.

12. The quantum-well device of claim 11 wherein said barrier layer additionally comprises P.

* * * * *